United States Patent
Voogel et al.

(10) Patent No.: US 7,109,746 B1
(45) Date of Patent: Sep. 19, 2006

(54) DATA MONITORING FOR SINGLE EVENT UPSET IN A PROGRAMMABLE LOGIC DEVICE

(75) Inventors: Martin L. Voogel, Los Altos, CA (US);
David P. Schultz, San Jose, CA (US);
Vasisht M. Vadi, San Jose, CA (US);
Philip D. Costello, Saratoga, CA (US);
Venu M. Kondapalli, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 103 days.

(21) Appl. No.: 10/806,697

(22) Filed: Mar. 22, 2004

(51) Int. Cl.
*H03K 19/173* (2006.01)

(52) U.S. Cl. .................. 326/38; 326/41; 326/113; 365/230.01; 365/189.01

(58) Field of Classification Search ............ 326/38–41; 365/189.01, 230.01; 716/19
See application file for complete search history.

(56) References Cited

U.S. PATENT DOCUMENTS 5,469,003 A * 11/1995 Kean ........................ 326/39
6,242,945 B1 * 6/2001 New ........................... 326/39
6,822,894 B1 11/2004 Costello et al.

OTHER PUBLICATIONS

U.S. Appl. No. 10/618,404, filed Jul. 11, 2003, Young.
U.S. Appl. No. 10/683,944, filed Oct. 10, 2003, Young.
U.S. Appl. No. 10/402,446, filed Mar. 27, 2003, Voogel et al.

* cited by examiner

*Primary Examiner*—Vibol Tan
(74) *Attorney, Agent, or Firm*—W. Eric Webostad

(57) ABSTRACT

Method and apparatus for data monitoring for error detection is described. A programmable logic device includes a configurable logic block having function generators, each of which is configurable for at least two programmable mode functions. The function generators are coupled to an array of memory cells for storing configuration bits for configuring the function generators. A primary address line is coupled to each memory cell spanning two or more of the function generators. A secondary address line is coupled to groups of memory cells associated with the function generators. A mask circuit is configured to selectively communicate a signal of the primary address line to a segment of the secondary address line or to a ground responsive in part to the program mode function.

14 Claims, 5 Drawing Sheets

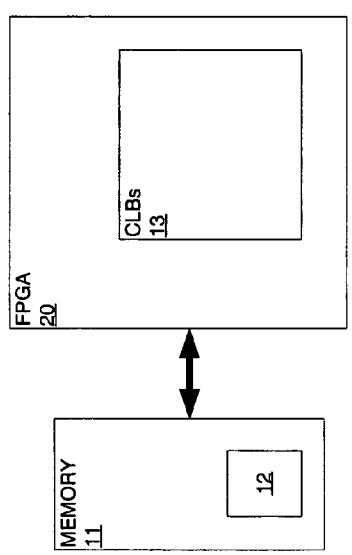
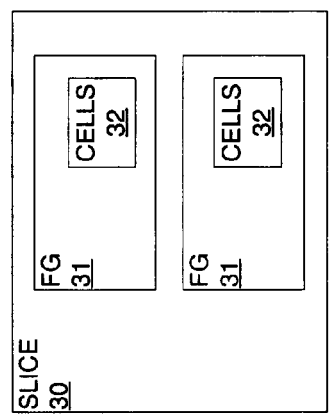

DATA MONITORING FOR SINGLE EVENT UPSET IN A PROGRAMMABLE LOGIC DEVICE

FIELD OF THE INVENTION

One or more aspects of the invention relate generally to data monitoring and more particularly to, configuration data monitoring for error detection.

BACKGROUND OF THE INVENTION

Memory cells, such as conventional static random access memory ("SRAM") cells, are susceptible to cosmic radiation, neutrons and alpha particles, among other external factors. Such external factors can lead to a change in state of such SRAM cells. This change in state caused by such external factors is known as a Single Event Upset ("SEU").

SEUs are becoming more problematic as semiconductor process geometries decrease ("shrink") and supply voltages for operation of integrated circuit transistors decrease. Thus, failure rate due to SEUs measured per megabit for a unit of time is increasing. Furthermore, the number of megabits per SRAM is also increasing with shrinkage of process geometries. Accordingly, the number of failures for an SRAM semiconductor die per unit of time due to SEUs is on the increase. This increase in SEU susceptibility may lead to a mean time to failure ("MTTF") rate of less than ten years.

To address the problem of SEUs, others have suggested implementing SRAM cells that are less susceptible to SEUs. However, such SEU hardened SRAM cells either use more area than conventional SRAM cells or are made using unconventional complementary metal-oxide semiconductor ("CMOS") processing technology.

In programmable logic devices ("PLDs"), such as field programmable gate arrays ("FPGAs"), configuration bits are used to program programmable logic. In conventional uses of FPGAS, configuration logic blocks ("CLBs") are configured to include lookup tables ("LUTs") though other configurations, such as shift registers ("SRs") and random access memories ("RAMs"), are possible. However, configuration bits used for configuring function generators ("FGs") as SRs or RAMs are a relatively small percentage of the total number of configuration bits used, as conventionally CLBs are configured for LUTs. Unfortunately, memory cells used for configuring conventional FGs as SRs or RAMs cannot be read from and written to at the same time without significant risk of data corruption. Furthermore, FGs conventionally share address lines, and thus heretofore memory cells used for LUTs could not be segmented from memory cells used for SRs or RAMS. Thus, all such memory cells were read only during non-write operation intervals.

Accordingly, it would be desirable and useful to provide means that would facilitate reading configuration bits stored in memory cells during write operations, such as for error checking to determine if an SEU has occurred. More particularly, it would be desirable and useful to provide means for a continuous readback of at least substantially all configuration bits. In a PLD, it would be desirable if such continuous readback were independent and transparent from a user implemented design in a configurable portion of the PLD.

SUMMARY OF THE INVENTION

An aspect of the invention is a programmable logic device. The programmable logic device includes a configurable logic block having function generators, each of which is configurable for at least two programmable mode functions. The function generators are coupled to an array of memory cells for storing configuration bits for configuring the function generators. A primary address line is coupled to each memory cell of the array of memory cells in a segment spanning two or more of the function generators. A secondary address line is coupled to groups of memory cells of the array of memory cells in separate segments, where each of the separate segments spans only one function generator of the function generators and where the groups of memory cells are respectively associated with the function generators. A mask circuit is configured to selectively communicate a signal of the primary address line to a segment of the secondary address line or to a ground responsive in part to the programmable mode function programmed.

Another aspect of the invention is a method for error checking, comprising: configuring a programmable logic device having function generators and associated memory cells for storing data to configure the function generators; providing a masking signal responsive to a write operation being active; partially responsive to the masking signal, grounding address lines of a portion of the memory cells used for configuring a portion of the function generators as random access memories; and while the write operation is active, allowing error checking of configuration bits in another portion of the memory cells used for configuring another portion of the function generators as lookup tables.

Another aspect of the invention is a method for error checking, comprising: configuring a programmable logic device having function generators and associated memory cells for storing data to configure the function generators; providing a masking signal responsive to a write operation being active; partially responsive to the masking signal, grounding address lines of a portion of the memory cells used for configuring a portion of the function generators as shift registers; and while the write operation is active, allowing error checking of configuration bits in another portion of the memory cells used for configuring another portion of the function generators as lookup tables.

Yet another aspect of the invention is a method for error checking, comprising: configuring a programmable logic device, the programmable logic device having function generators and associated memory cells, the memory cells for storing data to configure the function generators; static and continuous masking of a portion of the memory cells used to configure a portion of the function generators as shift registers; and allowing error checking of configuration bits in another portion of the memory cells while the write operation is active, the other portion of the memory cells used for configuring another portion of the function generators as lookup tables.

Still another aspect of the invention is a method for error checking, comprising: configuring a programmable logic device, the programmable logic device having function generators and associated memory cells, the memory cells for storing data to configure the function generators; static and continuous masking of a portion of the memory cells used to configure a portion of the function generators as random access memories; and allowing error checking of configuration bits in another portion of the memory cells while the write operation is active, the other portion of the memory cells used for configuring another portion of the function generators as lookup tables.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIG. 1 is a block diagram depicting an exemplary embodiment of an FPGA system.

FIG. 3 is a higher-level block diagram depicting an exemplary embodiment of a portion of a CLB.

DETAILED DESCRIPTION OF THE DRAWINGS

FIG. 1 is a block diagram depicting an exemplary embodiment of an FPGA system 10. Memory 11 may be any of a variety of known types of memory, including, but not limited to, SRAM, flash memory, PROM, EPROM, and EEPROM, among other forms of non-destructive read memory. Memory 11 may store configuration data 12 for configuring all or a portion of configurable logic blocks ("CLBs") 13. Memory 11 is coupled to FPGA 20 to communicate configuration data 12 thereto. Configuration data 12 may be communicated to FGPA 20 as a configuration bitstream.

Figure 2:
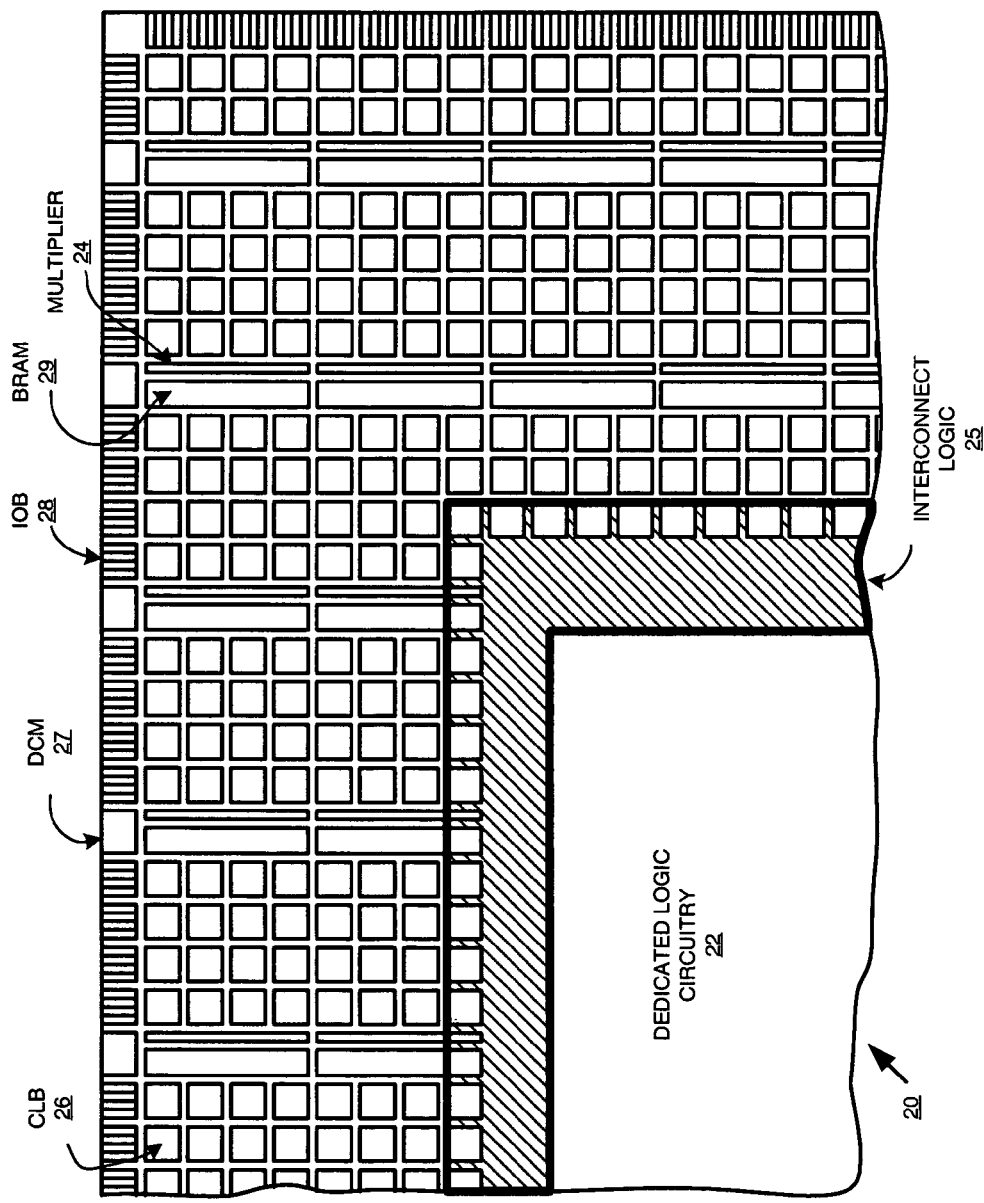
FIG. 2 is a block diagram depicting an exemplary embodiment of a portion of an FPGA.

FIG. 2 is a block diagram depicting an exemplary embodiment of a portion of FPGA 20 of FIG. 1. FPGA 20 includes CLBs 26, a digital clock manager ("DCM") 27, input/output blocks ("IOBs") 28, block random access memories ("BRAMs") 29, multipliers 24, dedicated logic circuitry 22 and interconnect logic 25, among other known elements.

In an another embodiment of the present invention, the FPGA has a columnar architecture as described in co-pending U.S. patent applications "Columnar Floorplan", by Steven P. Young, application Ser. No. 10/618,404 filed Jul. 11, 2003 and "Columnar Architecture", by Steven P. Young, application Ser. No. 10/683,944 filed Oct. 10, 2003, both of which are herein incorporated by reference in their entirety.

FIG. 3 is a block diagram depicting an exemplary embodiment of a portion of a CLB 26. This portion of CLB 26 is referred to as a "slice" 30, and slice 30 includes function generators ("FGs") 31, among other known circuitry. Though two FGS 31 are shown, fewer or more than two FGS 31 may be implemented in a slice 30.

Each FG 31 may be configured to function as a look-up table ("LUT"), a random access memory ("RAM") or a shift register ("SR"). Each FG 31 includes memory cells 32, such as SRAM cells, which may be referred to as configuration memory cells. In a "readback" mode, information stored in configuration memory cells 32 may be non-destructively read back to check whether there was any error in configuring FGs 31. However, when an FG is configured as a RAM or an SR, it is possible to have a write operation to such configuration memory cells 32 during a read back operation of such configuration memory cells 32. As these two operations may happen simultaneously, to prevent corruption of a write operation by a read back operation, masking circuitry is used.

When an FG 31 is configured as a LUT, a user does not write to configuration memory cells 32 of FG 31 during a write operation. Accordingly, FGs 31 configured as LUTs may be safely read during a write operation as those configuration memory cells 32 are not written to as part of a write operation. Notably, mode selection, whether LUT, RAM or SR, may be done on a per FG 31 basis.

Figure 4:
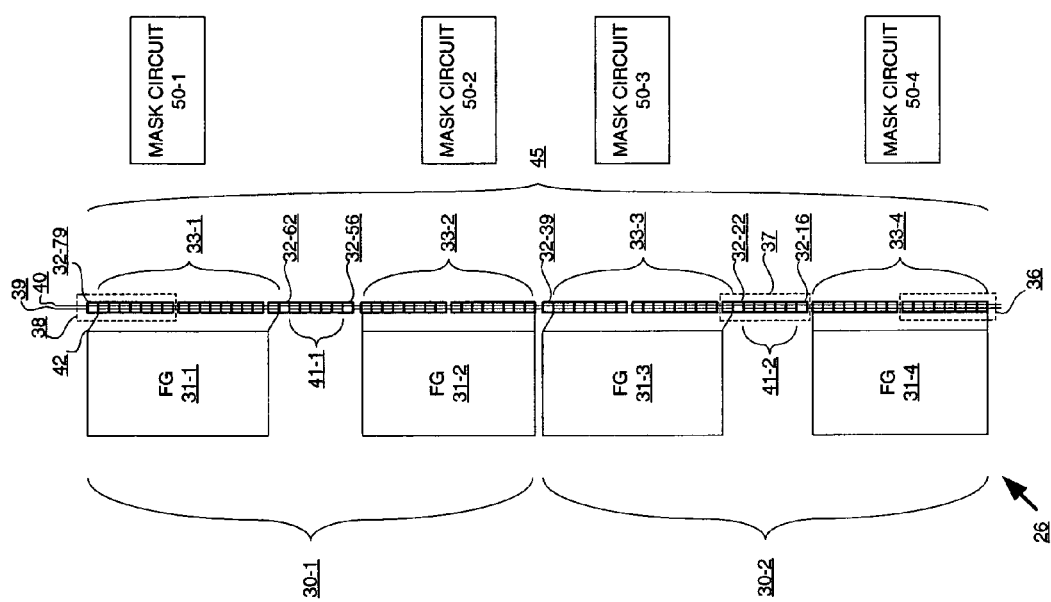
FIG. 4 is a lower-level block diagram depicting an exemplary embodiment of a portion of a CLB.

FIG. 4 is a block diagram depicting an exemplary embodiment of a portion of a CLB 26. CLB 26 includes slices 30-1 and 30-2. Slice 30-1 includes FG 31-1 and FG 31-2, and slice 30-2 includes FG 31-3 and FG 31-4. CLB 26 may include fewer or more FGs. CLB 26 includes other known circuitry, which is not described herein for purposes of clarity.

Each FG 31 is coupled to memory cells 32. In this depiction, each FG 31 is coupled to 16 memory cells though fewer or more memory cells may be used. FG 31-1 is coupled to 16 memory cells 32 in group 33-1. There are four groups of memory cells 32, namely, groups 33-1, 33-2, 33-3, and 33-4, where each group 33 respectively corresponds to an FG 31-1, 31-2, 31-3, and 31-4.

Each group 33 includes memory cells. For purposes of clarity by way of example, each group 33 includes 16 memory cells, which are formed of at least two 8×1 (row-by-column) arrays of memory cells. Of course, other amounts and configurations of memory cells may be used. A primary address line 40 is shared among memory cells 32. A secondary address line 39, or more particularly secondary address line 39 segment, is shared among memory cells 32 for the same FG 31. The secondary address line 39 is only shared for same memory cells 32 within the same group 33 for an FG 31. Memory cells 32 in groups 41-1 and 41-2 may be used, such as for storing configuration bits for mask circuit 50 of FIG. 5. Thus, FGs 31 are coupled to an array of memory cells 45 formed of groups of memory cells 33 and 41.

Because of physical design rules memory cells 32-16, 32-22, 32-39, 32-56, 32-62, 32-79 have address lines which are disconnected ("broken") at approximately the middle of the memory cell, for example at a polycrystalline silicon ("polysilicon") layer, making the memory cell unusable. Notably, this limitation of physical design rules may not apply for other sets of layout architectures with same or different design rules. Such other layout architectures may allow disconnects at the border of memory cells, facilitating connecting FGs 31-1 and 31-3 straight across to memory cells 32 instead of diagonally as indicated by reference line 42. Furthermore, this would facilitate using only one type of array with secondary address line 39 breaks, such as an 8×1 sub-array of memory cells with tie-ins of secondary address line 39 to primary address line 40 at least proximal to the row-side external borders of such memory cells at the first and eighth positions of such sub-array. Notably, gaps are shown between 8×1 arrays for clarity. However, memory cells 32 may be printed without any such gaps to keep layout more regular to improve process yield. Although, it should be appreciated that gaps in memory cells, such as at locations of memory cells 32-16, 32-22, 32-39, 32-56, 32-62, and 32-79, may be used; no memory cells need be formed in such regions.

In this example, there are two types of 8×1 arrays of memory cells 32 with tie-ins. In array type 38, a first position (1,1) memory cell 32 has a secondary address line 39 wired to a primary address line 40. In array type 37, a second position (2,1) memory cell 32 and an eighth position (8,1) memory cell 32 each having a secondary and primary address lines 39 and 40 wired together. Array type 36 has no connecting of primary address line 40 and secondary address line 39 for memory cells 32. Thus, in the example, there is an 80×1 array of memory cells formed of ten 8×1 memory cell arrays, in the following order of array type: 38, 36, 37, 36, and 36, which order is repeated. Accordingly, memory cells 32 at positions <16>, <22>, <39>, <56>, <62> and <79> are used for segmenting secondary address line 39 among FGs 31. Thus, it should be appreciated that a memory cell 32 within an FG 31 group 33 only shares a secondary address line 39 with another memory cell 32 within the same FG 31 group 33.

Secondary address line 39 is hard-wired to primary address line 40 at locations proximal to memory cells 32 at positions <16>, <22>, <39>, <56>, <62> and <79>. Accordingly, address lines 39 and 40 are electrically the same address line with respect to memory cells 32 in groups 41-1 and 41-2.

Each FG 31 has an associated mask circuit 50. Thus, mask circuits 50-1, 50-2, 50-3, and 50-4 are respectively associated with FGs 31-1, 31-2, 31-3, and 31-4.

Figure 5:
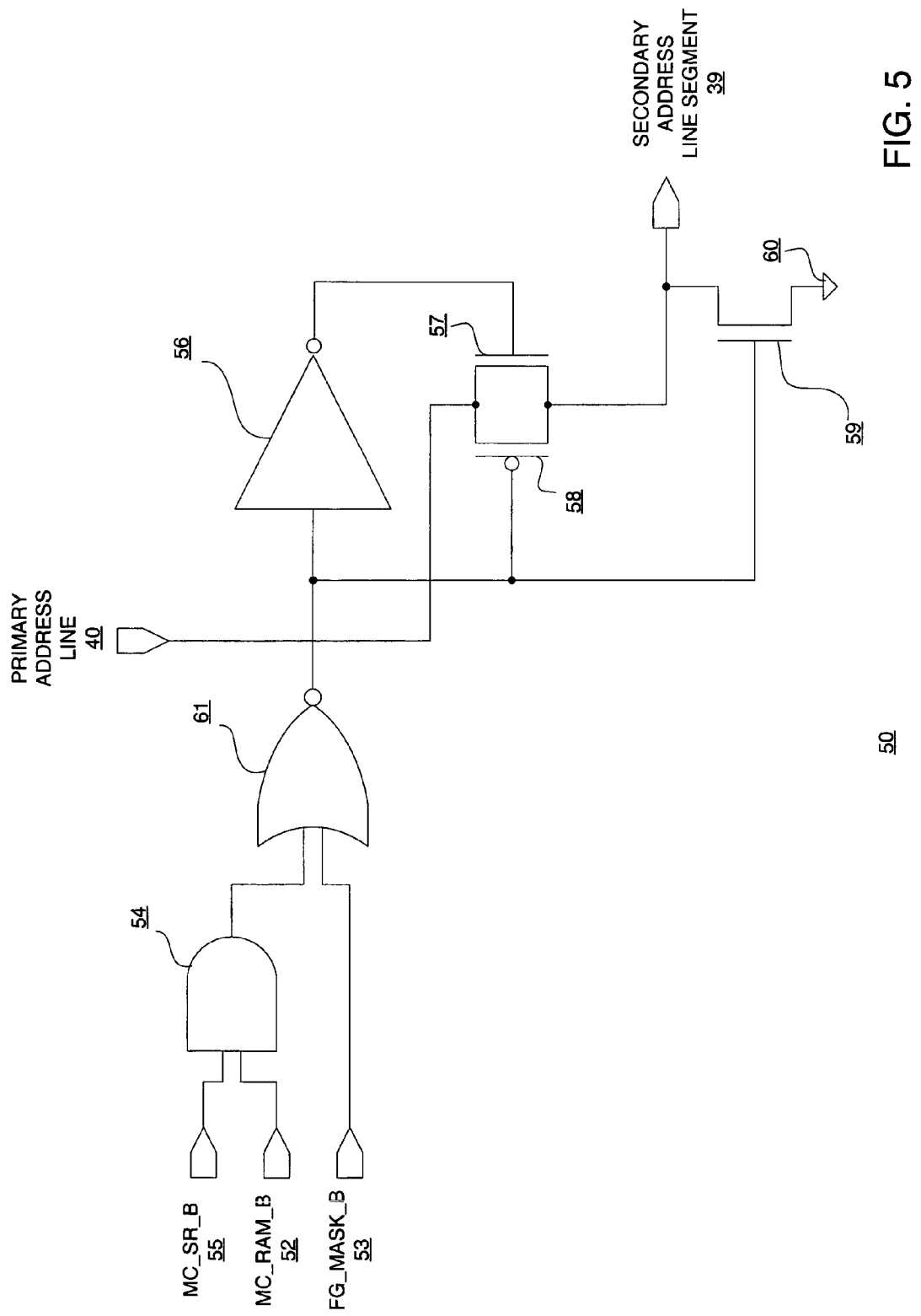
FIG. 5 is a schematic diagram depicting an exemplary embodiment of a mask circuit.

FIG. 5 is a schematic diagram depicting an exemplary embodiment of a mask circuit 50. Inputs to mask circuit 50 are memory cells configured for a shift register ("MC_SR_B") signal 55, memory cells configured for a RAM ("MC_RAM_B") signal 52, FG masking ("FG_MASK_B") signal 53, and primary address line signal 40. Output from mask circuit 50 is provided to a secondary address line 39 segment associated with an FG 31 shown in FIG. 4.

Inputs 55 and 52 are inputs to AND gate 54, the output from AND gate 54 and input 53 are inputs to NOR gate 61. Output from NOR gate 61 is provided to a gate of p-type transistor 58 and a gate of n-type transistor 59 and to an input of inverter 56. Primary address line 40 signal is provided to a common node of a source of n-type transistor 57 and a source of p-type transistor 58. Output of inverter 56 is provided as an input to a gate of n-type transistor 57. Output of drains of n-type transistor 57 and p-type transistor 58 at a common node is provided to a source of n-type transistor 59, where the drain of n-type transistor 59 is connected to ground 60. Output of mask circuit 50 is sourced from a source of n-type transistor 59 for providing to a secondary address line 39 segment for an FG 31 shown in FIG. 4.

With continuing reference to FIG. 5 and renewed reference to FIG. 4, operation of mask circuit 50 is described.

When an FG 31 is configured as a LUT, MC_SR_B signal 55 and MC_RAM_B signal 52 are both equal to a binary one. In which state, FG_MASK_B signal 53 has no effect on a secondary address line 39 segment signal. Accordingly, the "LUT" secondary address line 39 segment is coupled to the primary address line 40. Thus, FG 31 configured as a LUT may be read during a write operation.

When an FG 31 is configured as an SR, MC_SR_B signal 55 (where "B" is to indicate a "bar" or "complement" or inverted version of a signal) is equal to a binary zero and MC_RAM_B signal 52 is equal to a binary one. In which state, if FG_MASK_B signal 53 is equal to a binary one, the "SR" secondary address line 39 segment is coupled to the primary address line 40. Thus, FG 31 configured as a SR may be read as no write operation is occurring. If, however, in this state FG_MASK_B signal 53 is equal to a binary zero, meaning that a write operation is occurring, then the "SR" secondary address line 39 segment is coupled to ground 60 via transistor 59.

When an FG 31 is configured as a RAM, MC_SR_B signal 55 is equal to a binary one and MC_RAM_B signal 52 is equal to a binary zero. In which state, if FG_MASK_B signal 53 is equal to a binary one, the "RAM" secondary address line 39 segment is coupled to the primary address line 40. Thus, FG 31 configured as a RAM may be read as no write operation is occurring. If, however, in this state FG_MASK_B signal 53 is equal to a binary zero, meaning that a write operation is occurring, then the "RAM" secondary address line 39 segment is coupled to ground 60 via transistor 59.

If FG_MASK_B signal is equal to a binary one, meaning that no write operation is occurring, then read back of a configured FG 31 may be done regardless as to mode, SR, RAM or LUT. In other words, when FG_MASK_B signal is equal to a binary one, inputs MC_SR_B 55 and MC_RAM_B 52 have no impact on output of mask circuit 50, namely, secondary address line 39 segment is coupled to primary address line 40.

Of course, other logical embodiments of mask circuit 50 may be used to perform the multiplexing for coupling a secondary address line 39 segment to either a primary address line 40 or ground 60.

Notably, during a readback operation, one or more FGs 31 configured as one or more SRs or RAMs return invalid data if a write operation is occurring, though other bits, such as those from one or more FGs 31 configured as one or more LUTS, are read. Invalid data returned from such FGs 31 configured as one or more SRs or RAMs may be ignored in a readback data interpretation. Thus, though FG configured RAM and SR bits cannot be read back during a write operation, such bits may be protected against corruption by masking, dynamically masking responsive to a write operation or masking statically and continuously, all FGs configured as RAMs and SRs from readback. Notably, memory cells of FGs configured as RAMs or SRs may technically be read during a readback operation; however, the data read from such memory cells is invalid and thus readback circuitry masks out such invalid data for data interpretation, such as error checking.

Figure 6B:
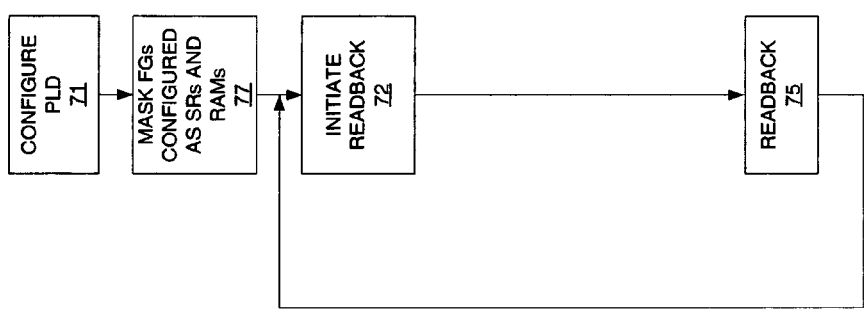
FIGS. 6A and 6B are flow diagrams depicting alternative exemplary embodiments of respective programmable logic device ("PLD") error checking flows.
Figure 6A:
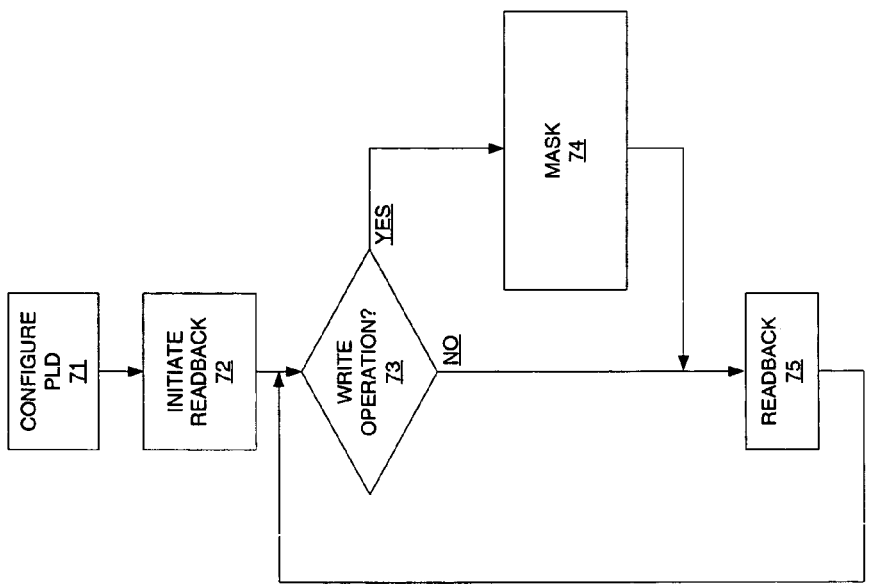

FIG. 6A is a flow diagram depicting an exemplary embodiment of a programmable logic device ("PLD") readback flow 70. At 71, a PLD is configured with configuration bits. At 72, readback is initiated. At 73, it is determined whether a write operation is occurring. Responsive to a write operation occurring, readback of FGs configured as SRs and RAMs is masked at 74, and readback continues at 75 with continual monitoring for initiation or cessation of write operations. In other words, readback of memory cells of FGs configured as SRs and RAMs is precluded; however, readback of memory cells of FGs configured as LUTS, as well as memory cells of other PLD components, is not precluded. If a write operation is not occurring, readback proceeds at 75 without masking of FGs configured as SRs and RAMS and with continual monitoring for initiation or cessation of write operations. Notably, once a write to an FG configured as an SR or a RAM has occurred, data may have been changed from original values.

FIG. 6B is a flow diagram depicting an alternative exemplary embodiment of a PLD readback flow 80. At 71, a PLD is configured with configuration bits. At 77, FGs configured as SRs and RAMs are masked. It may be problematic to do error checking because the current state of valid data is presently unknown. Thus, if an FG is going to be used as an SR or a RAM, a masking signal is applied statically and continuously such that it will be independent of a write operation occurring or not. Notably, with respect to FPGAs, FG_MASK_B signal 53 may be a "global" (meaning distributed substantially over an integrated circuit to multiple components) masking signal. For example, a global signal (e.g., GLUTMASK_B) may be asserted independently of a write operation. Accordingly, if such a global signal is asserted, memory cells in FGs configured as RAMs and SRs may not be read back even though no write operation is occurring. A global signal may be controlled or asserted by programming a configuration memory cell, such as a memory cell 32, which may be independent of whether or not a write operation is occurring. At 72, readback is initiated. At 75, readback proceeds and after readback is completed, PLD readback flow 80 loops back to initiate a readback at 72 for continuous monitoring.

Thus, because bits used for configuring FGs as SRs or RAMs are a relatively small percentage of the total number of configuration bits used in a conventional usage of an FPGA, a significant number of configuration bits, namely, those used for LUT configuration, may be read during both read and write operations. This ability promotes error checking, such as for an SEU, of a significant number of configuration bits more frequently. Furthermore, by repeatedly checking for write operations, closed-loop error checking may be done, where for iterations where write operations are not active all configuration bits may be checked and where for iterations where write operations are active a substantial number of configuration bits may be checked.

It should be appreciated that continuous readback has been described for all or substantially all configuration bits. Furthermore, by having separate circuitry for readback, facilitated by separate circuitry from a user instantiated design, such continuous readback may be done independently and transparently from the user instantiated design. Notably, such separate circuitry may be formed of dedicated or programmable circuitry.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A programmable logic device, comprising:
    a configurable logic block, the configurable logic block having function generators, each of the function generators configurable for at least two programmable mode functions;
    the function generators coupled to an array of memory cells, the array of memory cells for storing configuration bits for configuring the function generators;
    a primary address line coupled to each memory cell of the array of memory cells in a segment spanning two or more of the function generators;
    a secondary address line coupled to groups of memory cells of the array of memory cells in separate segments, each of the separate segments spanning only one function generator of the function generators, the groups of memory cells being respectively associated with the function generators; and
    a mask circuit configured to selectively communicate a signal of the primary address line to a segment of the secondary address line or to a ground responsive in part to the programmable mode function programmed.

2. The programmable logic device, according to claim 1, wherein the mask circuit is configured to selectively communicate the signal in partial response to operation state of the configurable logic block.

3. The programmable logic device, according to claim 2, wherein the operation state is a read state.

4. The programmable logic device, according to claim 2, wherein the operation state is a write state.

5. The programmable logic device, according to claim 2, wherein the at least two programmable mode functions are a lookup table and a random access memory.

6. The programmable logic device, according to claim 2, wherein the at least two programmable mode functions are a lookup table and a shift register.

7. The programmable logic device, according to claim 1, wherein the groups of memory cells are sub-arrays of the array of memory cells.

8. The programmable logic device, according to claim 7, wherein the sub-arrays have a row width of sixteen.

9. The programmable logic device, according to claim 7, wherein the sub-arrays have a column width of one.

10. The programmable logic device, according to claim 1, wherein a portion of memory cells of the array of memory cells is not part of the groups of memory cells respectively associated with the function generators.

11. The programmable logic device, according to claim 10, wherein each of the memory cells in the portion of memory cells is spaced apart for segmentation of the secondary address line.

12. The programmable logic device, according to claim 11, wherein each of the memory cells in the portion of memory cells is not usable.

13. The programmable logic device, according to claim 11, wherein the array of memory cells is eighty rows by one column.

14. The programmable logic device, according to claim 13, wherein the portion of memory cells are located at positions <16>, <22>, <39>, <56>, <62> and <79> of the array of memory cells.

* * * * *